(12) United States Patent
Tang et al.

(10) Patent No.: US 7,768,300 B1
(45) Date of Patent: *Aug. 3, 2010

(54) PROGRAMMABLE LOGIC DEVICE PROVIDING SERIAL PERIPHERAL INTERFACES

(75) Inventors: Howard Tang, San Jose, CA (US); Roger Spinti, Milpitas, CA (US); San-Ta Kow, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/511,388

(22) Filed: Jul. 29, 2009

Related U.S. Application Data

(63) Continuation of application No. 11/761,221, filed on Jun. 11, 2007, now Pat. No. 7,570,078, which is a continuation-in-part of application No. 11/446,548, filed on Jun. 2, 2006, now Pat. No. 7,378,873.

(51) Int. Cl.
*H03K 19/177* (2006.01)
*G11C 8/00* (2006.01)

(52) U.S. Cl. .................... 326/39; 711/103; 365/185.33; 365/189.08

(58) Field of Classification Search .............. 326/37–41
See application file for complete search history.

(56) References Cited

U.S. PATENT DOCUMENTS

| 5,859,649 | A  | * | 1/1999 | Yiu et al. ................. 345/560 |
| 7,013,357 | B2 | * | 3/2006 | Murdock et al. ........... 710/240 |
| 7,206,219 | B2 | * | 4/2007 | Lee et al. .................. 365/154 |
| 7,265,578 | B1 | * | 9/2007 | Tang et al. ................. 326/40 |
| 7,397,274 | B1 | * | 7/2008 | Tang et al. ................. 326/40 |
| 7,631,223 | B1 | * | 12/2009 | Spinti et al. ................. 714/36 |

* cited by examiner

*Primary Examiner*—Vibol Tan

(57) ABSTRACT

In one embodiment, a programmable logic device (PLD) includes a slave port and a master port. The slave port can receive a configuration data bitstream and a slave clock signal from a master port of a first external device. The master port can provide the configuration data bitstream and a master clock signal from the PLD to a slave port of a second external device. An interface block in the PLD can pass the configuration data bitstream from the slave port through the PLD to the master port. In another embodiment, a PLD includes a slave serial peripheral interface (SPI) port and configuration memory. The slave SPI port can receive a configuration data bitstream and a slave clock signal from a master SPI port of an external device. The configuration memory stores the received bitstream for configuring the PLD.

14 Claims, 11 Drawing Sheets

PROGRAMMABLE LOGIC DEVICE PROVIDING SERIAL PERIPHERAL INTERFACES

CROSS-REFERENCE TO RELATED APPLICATIONS

This application is a continuation of U.S. patent application Ser. No. 11/761,221, filed Jun. 11, 2007, which is incorporated herein by reference in its entirety. U.S. patent application Ser. No. 11/761,221 is a continuation-in-part of U.S. patent application Ser. No. 11/446,548, filed Jun. 2, 2006, which is incorporated herein by reference in its entirety.

TECHNICAL FIELD

The present invention relates generally to integrated circuits and, more particularly, to configuration of programmable logic devices.

BACKGROUND

Programmable logic devices (PLDs), such as field programmable gate arrays (FPGAs) or complex programmable logic devices (CPLDs), may be programmed with configuration data to provide various user-defined features. For example, it is often desirable for users to program PLDs with particular input/output (I/O) functionality to support communication and interfacing of the PLDs with other devices as may be desired. As a result, significant numbers of user-programmable I/O pins may be needed to support such user-defined functionality in particular applications.

Unfortunately, certain conventional PLDs may use large numbers of I/O pins to implement manufacturer-specific programming interfaces to support the programming of the PLDs with configuration data from external computing devices. For example, such programming interfaces may be used to program memory of a PLD with configuration data to support non-volatile storage and internal transfer to the PLD's configuration memory.

Nevertheless, such programming interfaces often require the use of dedicated I/O pins. Because of the limited number of pins available on a given PLD, the use of dedicated programming interface pins can significantly reduce the number of I/O pins available for user-defined operation. Moreover, existing PLDs that may support more simplified programming interfaces with lower pin counts typically do not provide convenient ways to selectively boot from various available sources of configuration data, or they require use of interfaces that may not conveniently interface with external non-volatile memories (e.g., a JTAG interface). Accordingly, there is a need for an improved approach to the configuration of PLDs that, for example, provides users with ample I/O pins and permits configuration of the PLD to be performed through a convenient programming interface.

SUMMARY

In one embodiment of the invention, a programmable logic device includes a slave port adapted to receive a configuration data bitstream and a slave clock signal from a master port of a first external device, wherein the bitstream is clocked from the first external device to the PLD by the slave clock signal; a master port adapted to provide the configuration data bitstream and a master clock signal from the PLD to a slave port of a second external device, wherein the bitstream is clocked from the PLD to the second external device by the master clock signal; and an interface block adapted to pass the configuration data bitstream from the slave port through the PLD to the master port.

In another embodiment of the invention, a programmable logic device (PLD) includes a slave serial peripheral interface (SPI) port adapted to receive a configuration data bitstream and a slave clock signal from a master SPI port of an external device, wherein the bitstream is clocked from the external device to the PLD by the slave clock signal; and configuration memory adapted to store the configuration data bitstream received by the slave SPI port for configuring the PLD.

In another embodiment of the invention, a programmable logic device system includes a first external device including a master port; a second external device including a slave port connected to the master port of the first external device; and a programmable logic device (PLD) including a slave port connected to the master port of the first external device. The first external device is adapted to receive configuration data from the slave port of the second external device through the master port and to pass the configuration data from the master port to the slave port of the PLD The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of integrated circuits.

Figure 1:
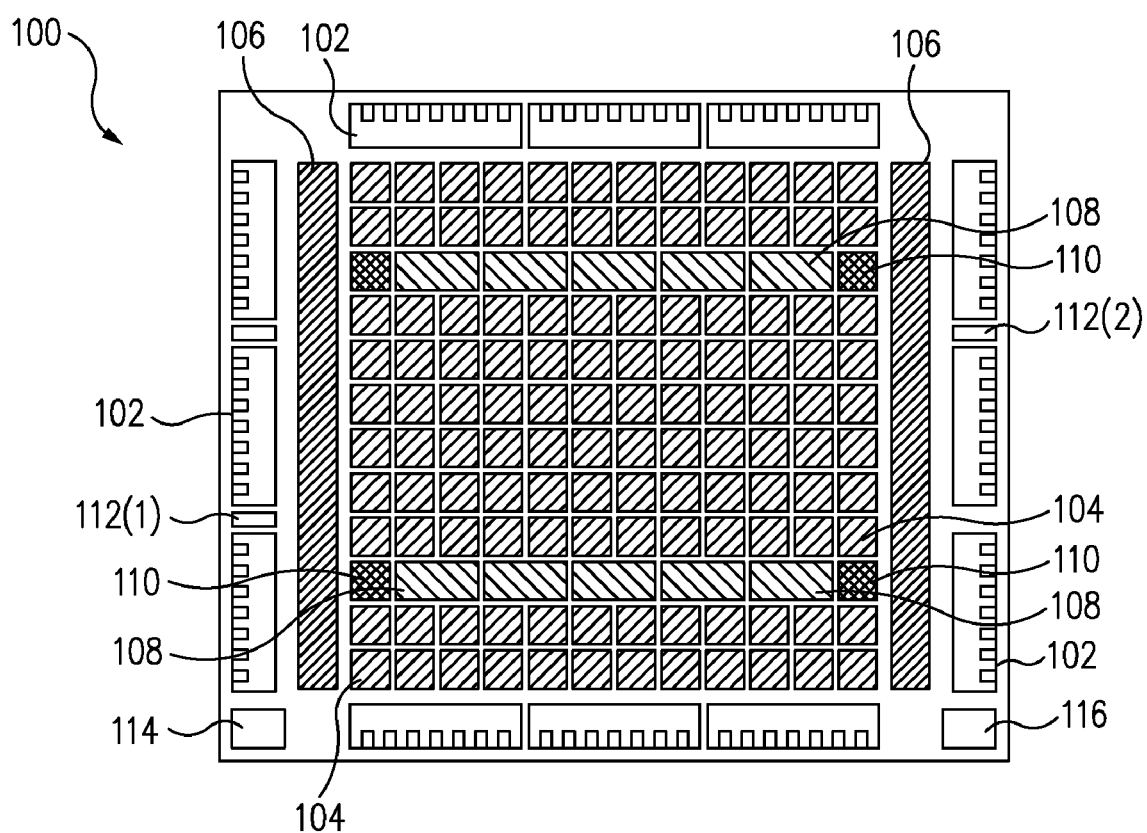
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 (e.g., an FPGA) includes I/O blocks 102 and programmable logic blocks 104. I/O blocks 102 provide I/O functionality (e.g., to support one or more I/O and/or memory interface standards) for PLD 100. Programmable logic blocks 104 (e.g., also referred to in the art as configurable logic blocks or logic array blocks) provide logic functionality for PLD 100, such as for example LUT-based logic typically associated with FPGAs.

PLD 100 may also include reprogrammable non-volatile memory 106 (e.g., blocks of EEPROM or flash memory), volatile memory 108 (e.g., block SRAM), clock-related circuitry 110 (e.g., PLL circuits), one or more data ports 112, configuration memory 114, and/or an interconnect 116. It should be understood that the number and placement of the various elements, such as I/O blocks 102, logic blocks 104, non-volatile memory 106, volatile memory 108, clock-related circuitry 110, data port 112, configuration memory 114, and interconnect 116, is not limiting and may depend upon the desired application. Furthermore, it should be understood that the elements are illustrated in block form for clarity and that certain elements, such as configuration memory 114 and interconnect 116, would typically be distributed throughout PLD 100, such as for example in and between logic blocks 104, to perform their conventional functions (e.g., storing configuration data that configures PLD 100 and providing routing resources, respectively).

Data ports 112 are also provided which may be used for programming PLD 100. For example, data port 112(1) may represent a serial peripheral interface (SPI) port. As understood by those skilled in the art, SPI is a serial interface standard established by Motorola Corporation of Schaumburg, Ill. Data port 112(2) may represent, for example, a joint test action group (JTAG) port employing standards such as Institute of Electrical and Electronics Engineers (IEEE) 1149.1 and/or IEEE 1532 standards. Data ports 112(1) and 112(2) are not both required, but one or the other or both may be included to receive configuration data and commands. PLD 100 may also include additional data ports such as, for example, a CPU port.

Non-volatile memory 106 may be used to store configuration data within PLD 100 for transfer to configuration memory 114 of PLD 100 upon power up or during reconfiguration of PLD 100. This may drastically reduce the time to reconfigure PLD 100 relative to an external bitstream (e.g., reduce the time from seconds to microseconds for loading of configuration data into configuration memory 114).

Non-volatile memory 106 may also be used to provide background programming and/or storage for PLD 100 in accordance with some embodiments of the present invention. For example, for storage functionality, non-volatile memory 106 may be used as non-volatile storage for a user or manufacturer to store various test data, system management information, manufacturing control information, failure statistics information for board level diagnostics, security bits, identification codes, identification code selection bits (e.g., one or more custom ID fuses), and/or other information as desired.

For example, for background programming, PLD 100 may remain in user mode, based on the configuration data stored in configuration memory 114 within PLD 100, while non-volatile memory 106 is programmed with new configuration data (e.g., a new user defined pattern). Once the new configuration data is stored in non-volatile memory 106, this data can be transferred from non-volatile memory 106 to configuration memory 114 to reconfigure PLD 100, a process sometimes referred to as refresh. The refresh process can be initiated by a signal or instruction provided to one of data ports 112 (e.g., sending an SPI-compliant instruction via data port 112(1) or providing a JTAG refresh instruction via data port 112(2)).

Figure 2:
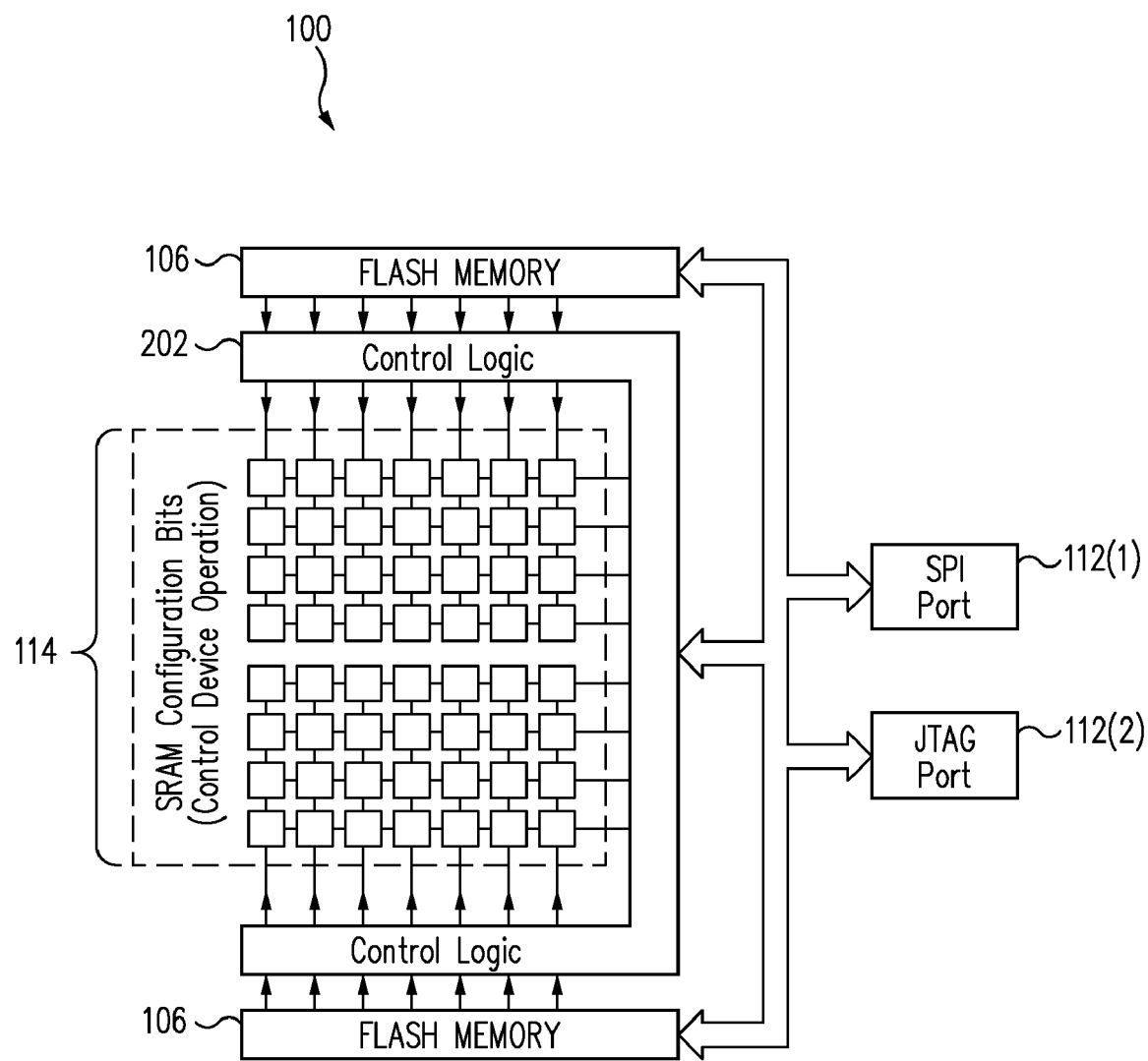
FIG. 2 shows a block diagram illustrating exemplary implementation details for a non-volatile memory and configuration memory of the programmable logic device of FIG. 1 in accordance with an embodiment of the present invention.

As a specific example, FIG. 2 shows a block diagram illustrating additional exemplary implementation details for PLD 100 of FIG. 1 in accordance with an embodiment of the present invention. As illustrated, PLD 100 includes configuration memory 114, non-volatile memory 106 (e.g., flash memory), and data ports 112 previously described in FIG. 1, and further includes control logic 202.

Configuration memory 114 (e.g., volatile SRAM cells or other types of volatile or non-volatile memory) are used in a conventional manner to store configuration data, which determines the user defined functions of PLD 100 (e.g., determines programmable functions of I/O blocks 102, logic blocks 104, and interconnect 116). Control logic 202 controls the internal transfer (for example, a massively parallel data transfer) of the configuration data from non-volatile memory 106 to configuration memory 114, as well as from data ports 112 to non-volatile memory 106 and configuration memory 114, as would be understood by one skilled in the art. Control logic 202 may represent core logic of PLD 100 such as FPGA-based logic circuits (e.g., lookup tables) or dedicated circuits.

It should be understood that flash memory represents an exemplary type of memory for non-volatile memory 106 which may be further implemented with appropriate security features. However, other types of non-volatile memory (e.g., EECMOS) that can be reprogrammed once or repeatedly may be substituted for non-volatile memory 106. Furthermore for example in accordance with one or more embodiments of the present invention, either non-volatile memory 106 or configuration memory 114 may be programmed (i.e., receive and store information in its memory) to store configuration data for PLD 100, but the device functionality of PLD 100 is determined by the information stored in configuration memory 114. Thus, PLD 100 may be configured (including reconfiguration or partial reconfiguration), for example, when information is programmed into configuration memory 114.

It should also be understood, in accordance with one or more embodiments of the present invention, that non-volatile memory 106 and configuration memory 114 may each be programmed (including reprogrammed), for example, via data port 112(1) or data port 112(2), depending upon the desired application or design requirements. Further details regarding programming may be found in U.S. Pat. No. 6,828,823 and U.S. Pat. No. 7,081,771, which are incorporated herein by reference.

Figure 3:
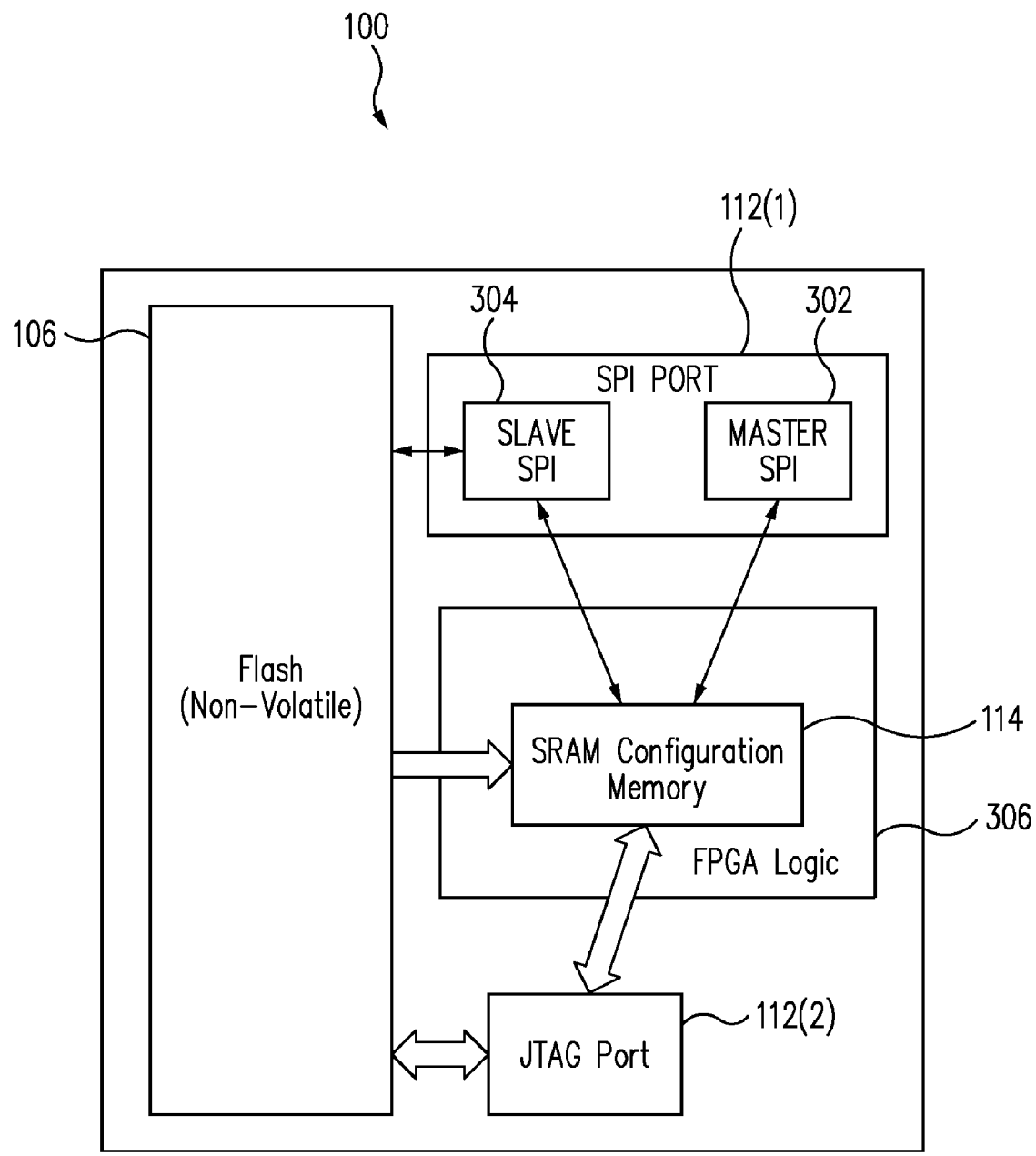
FIG. 3 shows a block diagram illustrating programming options of the programmable logic device of FIG. 1 in accordance with an embodiment of the present invention.

FIG. 3 shows a block diagram illustrating programming options of PLD 100 in accordance with an embodiment of the present invention. As illustrated, PLD 100 includes configuration memory 114, non-volatile memory 106 (e.g., flash memory), and data ports 112 previously described in FIGS. 1 and 2. PLD 100 further includes FPGA logic 306 which represents logic blocks 104 and other configurable aspects of PLD 100.

As also previously described in FIG. 1, data port 112(1) may be implemented as an SPI port and data port 112(2) may be implemented as a JTAG port. In this regard, it will be appreciated that data port 112(1) may operate in a master mode (i.e., sending a synchronizing clock signal to an external SPI-compatible device) or in a slave mode (i.e., receiving a synchronizing clock signal from an external SPI-compatible device). Accordingly, PLD 100 further includes master and slave SPI interface blocks 302 and 304, respectively, which may be implemented by control logic 202 of FIG. 2 to support data port 112(1) implemented as an SPI port. Control logic 202 may further support the implementation of data port 112(2) as a JTAG port.

In one embodiment, SPI port 112(1), master SPI interface block 302, and/or slave SPI interface block 304 may be implemented by one or more dedicated circuits. In another embodiment, SPI port 112(1), master SPI interface block 302, and/or slave SPI interface block 304 may be implemented by configurable logic (for example, programmable logic blocks 104) of PLD 100 to provide an SPI port.

As shown in FIG. 3, nonvolatile memory 106 and configuration memory 114 may each be programmed via data port 112(1) and data port 112(2). In particular, data port 112(1) (e.g., SPI port) may program configuration memory 114 through master SPI interface block 302, and may program and read back non-volatile memory 106 or configuration memory 114 through slave SPI interface block 304. Slave SPI interface block 304 may also be used to cause configuration data stored in non-volatile memory 106 to be copied into configuration memory 114 in response to a refresh command. Data port 112(2) (e.g., JTAG port) may program non-volatile memory 106 or configuration memory 114.

In general, programming non-volatile memory 106 may take longer (e.g., seconds) than programming configuration memory 114 (e.g., milliseconds). However, after non-volatile memory 106 has been programmed with suitable configuration data, non-volatile memory 106 can be employed to program configuration memory 114 much faster (e.g., microseconds) than would generally be possible via data ports 112 to provide essentially an instant-on capability (e.g., programming configuration memory 114 or logic blocks 104 approximately 200 microseconds after power-up). Non-volatile memory 106 may also be programmed while PLD 100 is operating (e.g., background or transparent operation), with configuration data from non-volatile memory 106 being transferred to configuration memory 114 when desired to reconfigure PLD 100.

PLD 100 offers certain advantages over various conventional PLDs which may lack non-volatile memory 106, configuration memory 114, and SPI interface support through data port 112(1). For example, by incorporating both non-volatile memory 106 and volatile configuration memory 114, PLD 100 can store configuration data in non-volatile memory 106 and not need external configuration devices that are required for SRAM only-based PLDs, while configuration memory 114 allows for infinite reconfigurability of PLD 100 that is generally not possible with non-volatile memory only-based PLDs (e.g., flash or EECMOS memory). In addition, both non-volatile memory 106 and configuration memory 114 (e.g., volatile memory) may be upgraded (i.e., programmed) via data ports 112 having low pin counts (e.g., an SPI port and/or a JTAG port). This contrasts with conventional non-volatile memory-based PLDs which may not allow programming of both volatile and non-volatile memories through such ports and may consequently necessitate programming through a manufacturer-specific programming port requiring a large number of dedicated I/O pins.

Accordingly, in accordance with one or more embodiments of the present invention, PLD 100 provides an essentially instant-on, remotely upgradeable, non-volatile, and dynamically reconfigurable device (e.g., integrated circuit) with the ability to program non-volatile memory 106 or configuration memory 114 directly, for example, via an SPI interface or a JTAG interface. Moreover, it will be appreciated that the implementation of an SPI port in particular can facilitate convenient interfacing with external SPI-compatible devices, such as non-volatile memories.

Figure 4:
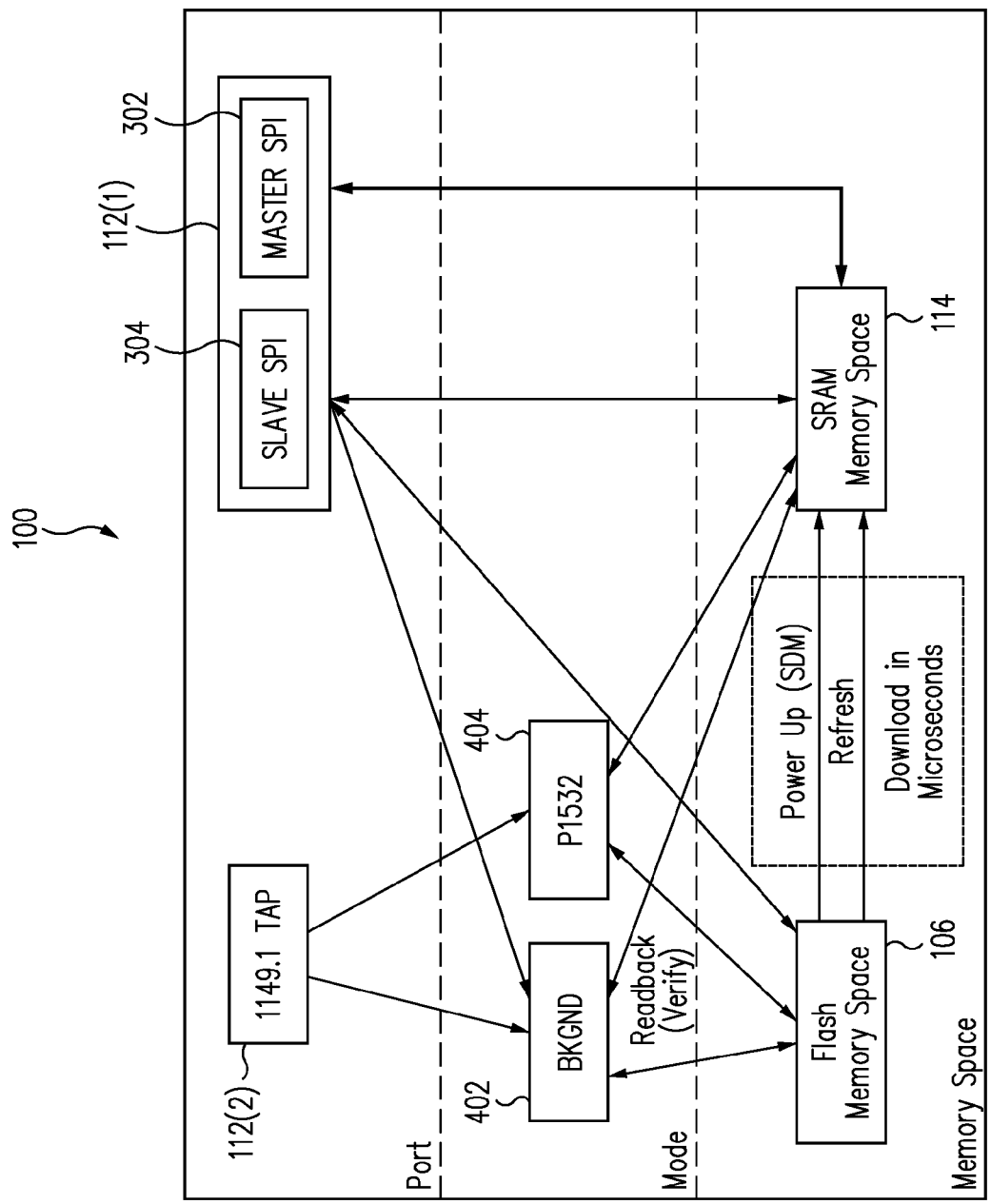
FIG. 4 shows a block diagram illustrating exemplary implementation details of data ports of the programmable logic device of FIG. 1 in accordance with an embodiment of the present invention.

FIG. 4 shows a block diagram illustrating exemplary implementation details of data ports 112 of PLD 100 in accordance with an embodiment of the present invention. In particular, data port 112(1) (e.g., SPI port) and data port 112(2) (e.g., JTAG port) are provided, which are used to provide external data (i.e., information, which may include control signals, configuration data, security bits, or other types of data) to non-volatile memory 106 (labeled Flash Memory Space) and configuration memory 114 (labeled SRAM Memory Space). As also shown in FIG. 4, multiple techniques are provided to program and configure the memory spaces of PLD 100.

For example, non-volatile memory 106 and configuration memory 114 may be programmed via data port 112(1). As previously discussed, data port 112(1) may be implemented as a SPI port supported by master SPI interface block 302 and slave SPI interface block 304. When data port 112(1) is operated in master mode, master SPI interface block 302 can be used to interface data port 112(1) with configuration memory 114 for programming. When data port 112(1) is operated in slave mode, slave SPI interface block 304 can be used to interface data port 112(1) for programming directly with non-volatile memory 106 or configuration memory 114. In this mode, slave SPI interface block 304 can also program non-volatile memory 106 through a background mode (BKGND) 402 for programming while PLD 100 continues to perform its system logic functions that are controlled or configured by configuration memory 114 (i.e., programming of non-volatile memory 106 is transparent to the device's logic operations).

Non-volatile memory 106 and configuration memory 114 may also be programmed via data port 112(2). For example, data port 112(2) (e.g. a JTAG port) may be implemented as an IEEE 1149.1 compliant test access port (TAP) and used to program non-volatile memory 106 or configuration memory 114 to allow in-system programmability or programming through a device-programmer system. Appropriate programming algorithms and circuitry may be designed to be fully IEEE 1532 compliant to allow programming via an IEEE 1532 programming mode 404, which allows for universal support from general automated test equipment (ATE) and other types of test systems. Data port 112(2) may also be used to program non-volatile memory 106 in background mode 402.

After non-volatile memory 106 or configuration memory 114 is programmed, a standard verify cycle may be performed by either of data ports 112. For example, background mode 402 or IEEE 1532 programming mode 404 may be used to read back the configuration data stored in non-volatile memory 106 or configuration memory 114 to ensure or verify that the configuration data has been properly loaded.

If CIB select fuse 514 corresponds to a second logic state (e.g., a programmed state), multiplexer 516 will be switched to provide slave SPI interface block 304 with CIB signals 518 which may control SPI interface block 304 in a manner determined by user-defined logic 520. Advantageously, by operating slave SPI interface block 304 through CIB signals 518, user-defined logic 520 may utilize slave SPI interface block 304 to program, read, and refresh non-volatile memory 106 and/or configuration memory 114.

As shown below in Table 1, the specific behavior of pins 522 can depend upon whether data port 112(1) operates in master mode or slave mode.

TABLE 1

| Data Port 112(1) | Pins Behavior | | | | |
|---|---|---|---|---|---|
| (SPI Interface) | CCLK | CSSPIN | CSSPISN | SISPI | SOSPI | Applications |
| Master | Output | Output | User I/O | Output | Input | Clock data out of SPI device to boot up FPGA |
| Slave | Input | User I/O | Input | Input | Output | Access SRAM fuses and Flash fuses in FPGA |

Figure 5:
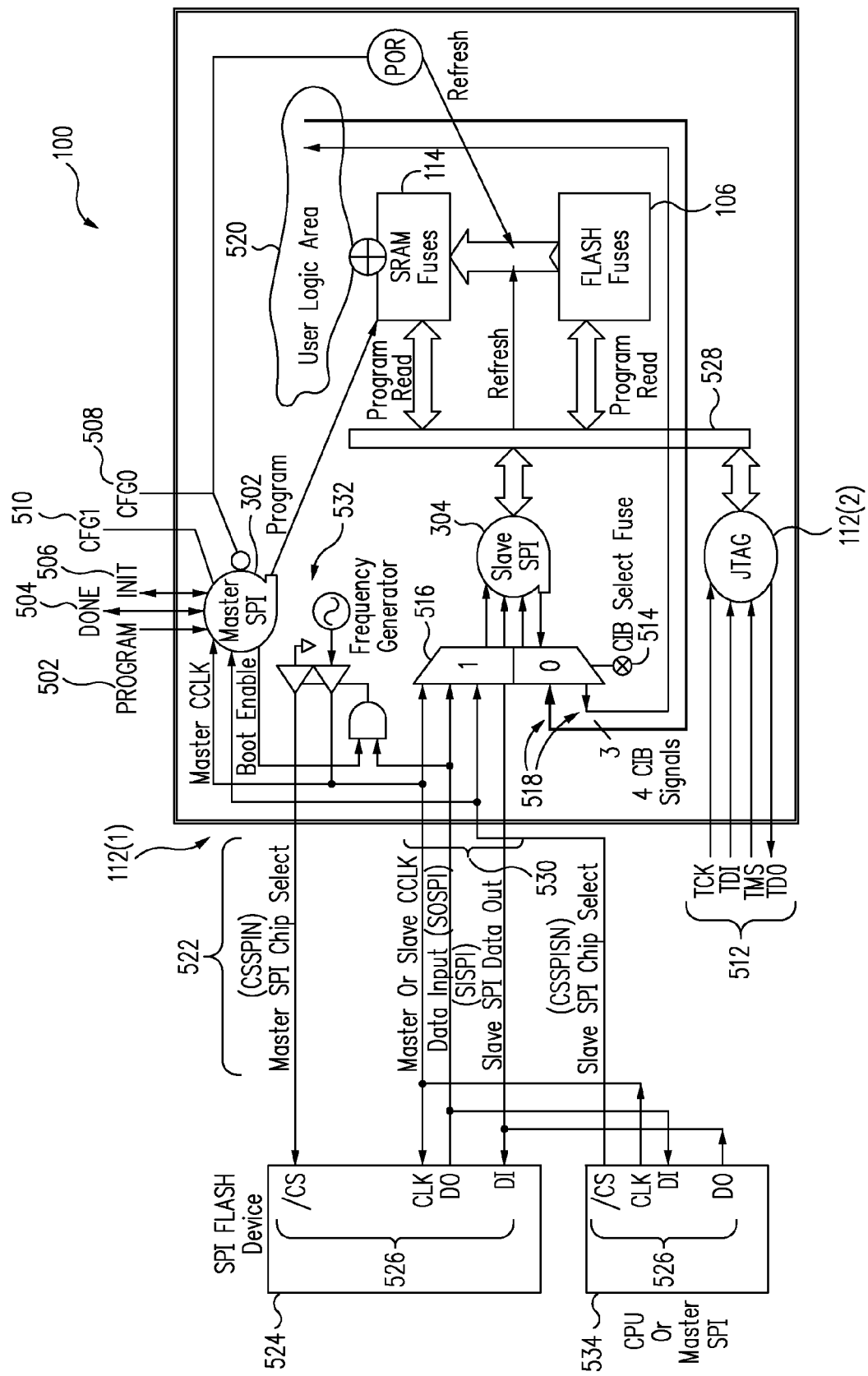
FIG. 5 shows a block diagram illustrating further exemplary implementation details of data ports of the programmable logic device of FIG. 1 in accordance with an embodiment of the present invention.

FIG. 5 shows a block diagram illustrating further exemplary implementation details of data ports 112 of PLD 100 in accordance with an embodiment of the present invention. As illustrated, data port 112(1) may be implemented to support a plurality of pins 522 (labeled CSSPIN, CCLK, SOSPI, CSSPISN, and SISPI) for interfacing PLD 100 with one or more external devices, such as an external non-volatile memory 524 (e.g., an SPI serial flash memory) and a CPU or master SPI device 534. In this regard, it will be appreciated that various pins 522 of data port 112(1) may be connected with conventional SPI pins 526 of external non-volatile memory 524 or CPU or master SPI device 534. In addition, data port 112(2) may be implemented to support a plurality of pins 512 (labeled TCK, TDI, TMS, and TDO) for interfacing PLD 100 with external devices supporting JTAG interfaces.

As further illustrated in FIG. 5, the CCLK and SOSPI pins are connected with additional clock/logic circuitry 532, and the CCLK pin is further connected with master SPI interface block 302. The CSSPISN pin is also connected with master SPI interface block 302 and may optionally be used to disable master SPI interface block 302 when data port 112(1) is operated in slave mode in order to avoid contention between master SPI interface block 302 and slave SPI interface block 304.

A subset 530 of pins 522 may connect with slave SPI interface block 304 through a multiplexer 516. Slave SPI interface block 304 is also connected with a common interface block (CIB) 528 of PLD 100 to facilitate the interfacing of pins 530 with non-volatile memory 106 and/or configuration memory 114. As illustrated, data port 112(2) may also connect with CIB 528 to facilitate the interfacing of pins 512 with non-volatile memory 106 and/or configuration memory 114.

A CIB select fuse 514 may be programmed to select between signals provided at pins 530 and a set of common interface block (CIB) signals 518. For example, in one embodiment, if CIB select fuse 514 corresponds to a first logic state (e.g., an unprogrammed state), multiplexer 516 will be switched to provide slave SPI interface block 304 with signals provided at pins 530 to provide an SPI port operating in slave mode.

For example, when data port 112(1) is operated in master mode, configuration data can be received from external non-volatile memory 524 and programmed into configuration memory 114. In this mode, the CCLK, CSSPIN, and SISPI pins operate as outputs to provide clock, master chip select, and data output signals, respectively to external non-volatile memory 524. In addition, the SOSPI pin operates as a data input to receive data input signals (e.g., configuration data) from external non-volatile memory 524. As also shown in Table 1, the CSSPISN pin remains available to be used as a user I/O pin by PLD 100.

When data port 112(1) is operated in slave mode, configuration data can be received from external non-volatile memory 524 or CPU or master SPI device 534 to be programmed into configuration memory 114 or non-volatile memory 106 as previously described herein. In this mode, the CCLK, CSSPISN, and SISPI pins operate as inputs to receive clock, slave chip select, and data input signals (i.e., configuration data), respectively. In addition, the SOSPI pin provides data output signals. As also indicated in Table 1, the CSSPIN pin remains available to be used as a user I/O pin by PLD 100 while in slave mode.

PLD 100 further includes a PROGRAM pin 502, a DONE pin 504, and an INIT pin 506, each of which is connected with master SPI interface block 302. PROGRAM pin 502 can be used to trigger master SPI interface block 302 to reboot PLD 100 and therefore cause configuration data to be loaded from external non-volatile memory 524 into configuration memory 114 or from non-volatile memory 106 into configuration memory 114. DONE pin 504 indicates whether a refresh operation (i.e., a loading of configuration data into configuration memory 114) has been performed. INIT pin 506 indicates whether such a refresh operation is successful.

Advantageously, PLD 100 can be configured to boot from non-volatile memory 106 or external non-volatile memory 524 interfaced with data port 112(1). For example, in one embodiment, PLD 100 may further include a configuration pin 508 (labeled CFG0) which may be used to determine the response of PLD 100 to a power-on reset operation. For example, if configuration pin 508 is set to a logical high value, then master SPI block 302 may be disabled and configuration data may be loaded from non-volatile memory 106 into configuration memory 114 when PLD 100 is powered on. If configuration pin 508 is set to a logical low value, then configuration data may be loaded into configuration memory 114 through master SPI interface block 302 or slave SPI interface block 304 of data port 112(1), or through data port 112(2) (e.g., JTAG port) when PLD 100 is powered on.

In another embodiment, PLD 100 may further include another configuration pin 510 (labeled CFG1) which, in combination with configuration pin 508, may determine the particular boot sequence performed by PLD 100. In one embodiment, configuration pin 508 may be implemented as a dedicated pin and configuration pin 510 may be implemented as a shared pin (i.e., may be recovered as a user I/O pin). Table 2 below identifies the corresponding boot modes of PLD 100 as determined by exemplary signal values applied to configuration pins 508 and 510.

TABLE 2

| Configuration Mode | First Boot | Second Boot | CFG0 | CFG1 |
|---|---|---|---|---|
| Dual Boot Mode | SPI | Internal Flash | 0 | 0 |
| | Internal Flash | SPI | 0 | 1 |
| Self Download Mode (SDM) | Internal Flash | N/A | 1 | X |
| 1149.1 TAP | N/A | N/A | X | X |

For example, if both of configuration pins 508 and 510 are set to logical low values when PLD 100 is powered on (i.e., when a power-on-reset operation is performed), PLD 100 may first attempt to boot from external non-volatile memory 524 through data port 112(1) and, if the first boot attempt is unsuccessful, then PLD 100 may attempt to boot from non-volatile memory 106. It will be appreciated from Table 2 above that this order may be reversed if configuration pin 510 is set to a logical high value. In addition, a single attempt to boot from non-volatile memory 106 will be made if configuration pin 508 is set to a logical high value. As also set forth in Table 2, the values of configuration pins 508 and 510 do not bear upon the booting of PLD 100 from data port 112(2) when under JTAG control.

In accordance with additional embodiments of the present invention, a PLD may be implemented a plurality of SPI ports which may be used to facilitate additional programming and readback features. For example, in one embodiment, a master SPI port of the PLD may be configured to program an external memory with data received through a slave SPI port of the PLD. In another embodiment, the slave SPI port of a PLD may be used to program or refresh the PLD with configuration data and/or read configuration data from the PLD.

Figure 6:
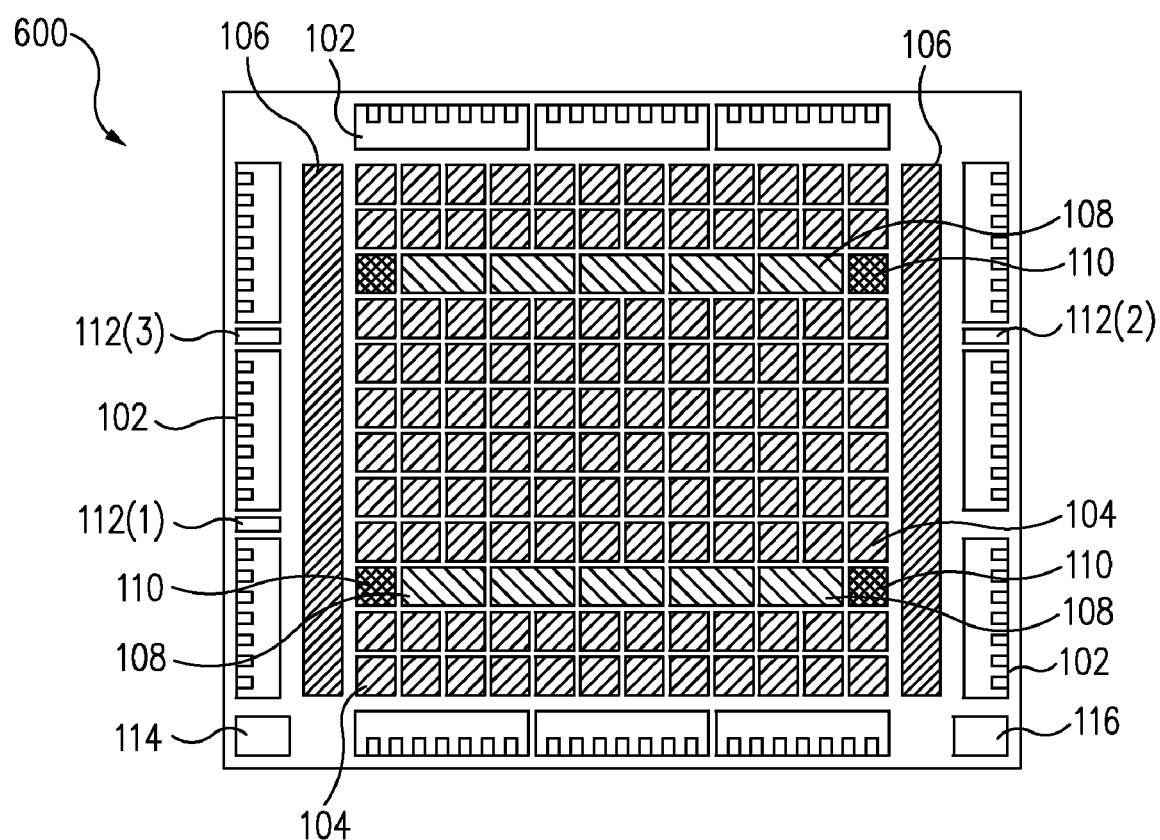
FIG. 6 shows a block diagram illustrating another exemplary programmable logic device in accordance with an embodiment of the present invention.

FIG. 6 shows a block diagram illustrating an exemplary PLD 600 in accordance with an embodiment of the present invention. It will be appreciated that PLD 600 may be implemented in a similar fashion as PLD 100 of FIG. 1, with various aspects of PLD 100 also included in PLD 600. As shown in FIG. 6, PLD 600 also includes an additional data port 112(3) which may be implemented, for example, as an SPI port. In this regard, data ports 112(1) and 112(3) may be implemented as master and slave SPI ports, respectively. Optionally, PLD 600 may be implemented without non-volatile memory 106.

Figure 7:
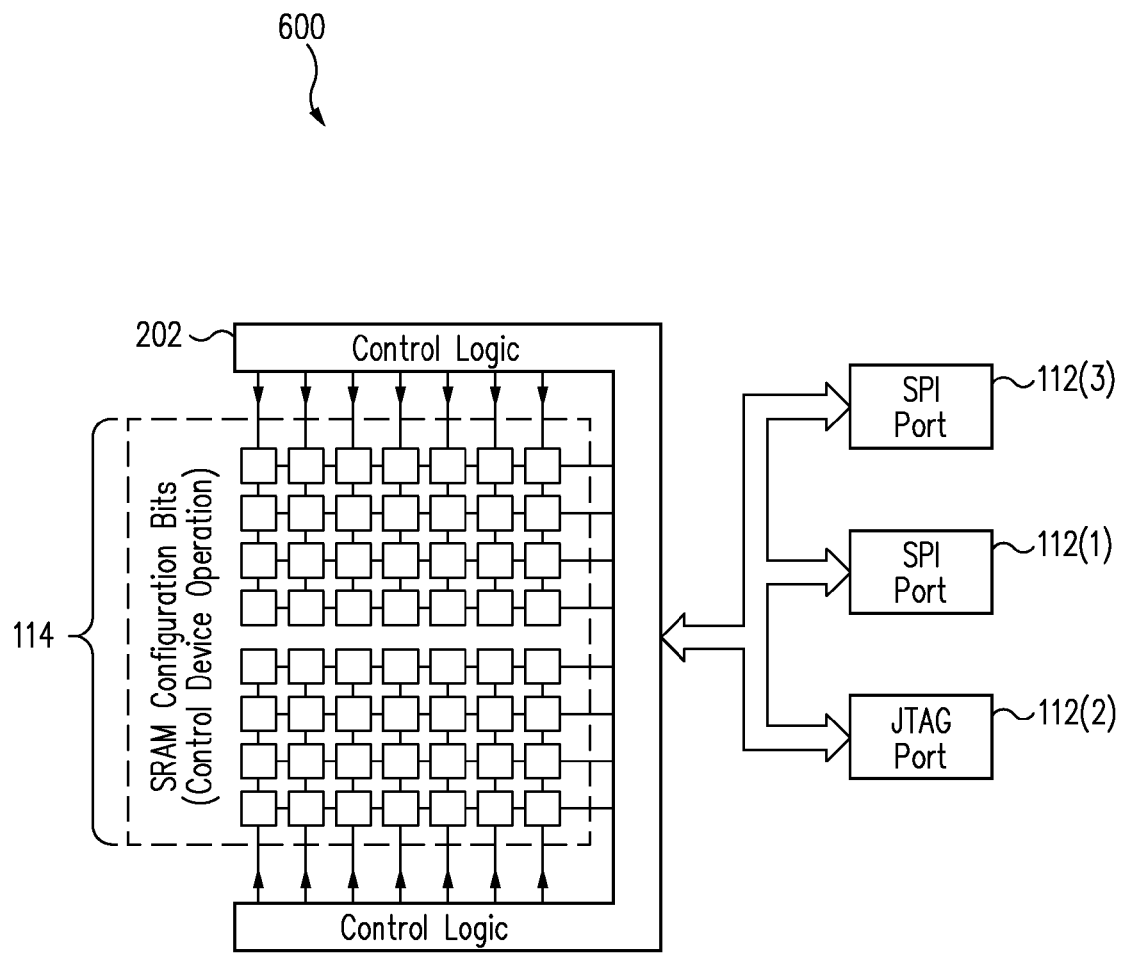
FIG. 7 shows a block diagram illustrating exemplary implementation details for configuration memory of the programmable logic device of FIG. 6 in accordance with an embodiment of the present invention.

FIG. 7 shows a block diagram illustrating additional exemplary implementation details for PLD 600 of FIG. 6 in accordance with an embodiment of the present invention. Similar to PLD 100, PLD 600 includes configuration memory 114, control logic 202, and data ports 112(1) and 112(2). PLD 600 also includes data port 112(3). Optionally, PLD 600 does not include non-volatile memory 106 of PLD 100. Control logic 202 of FIG. 7 controls the transfer of the configuration data from data ports 112 to configuration memory 114, as would be understood by one skilled in the art. For example, configuration memory 114 may be programmed (including reprogrammed) via data ports 112(1), 112(2), or 112(3), depending upon the desired application or design requirements.

Figure 8:
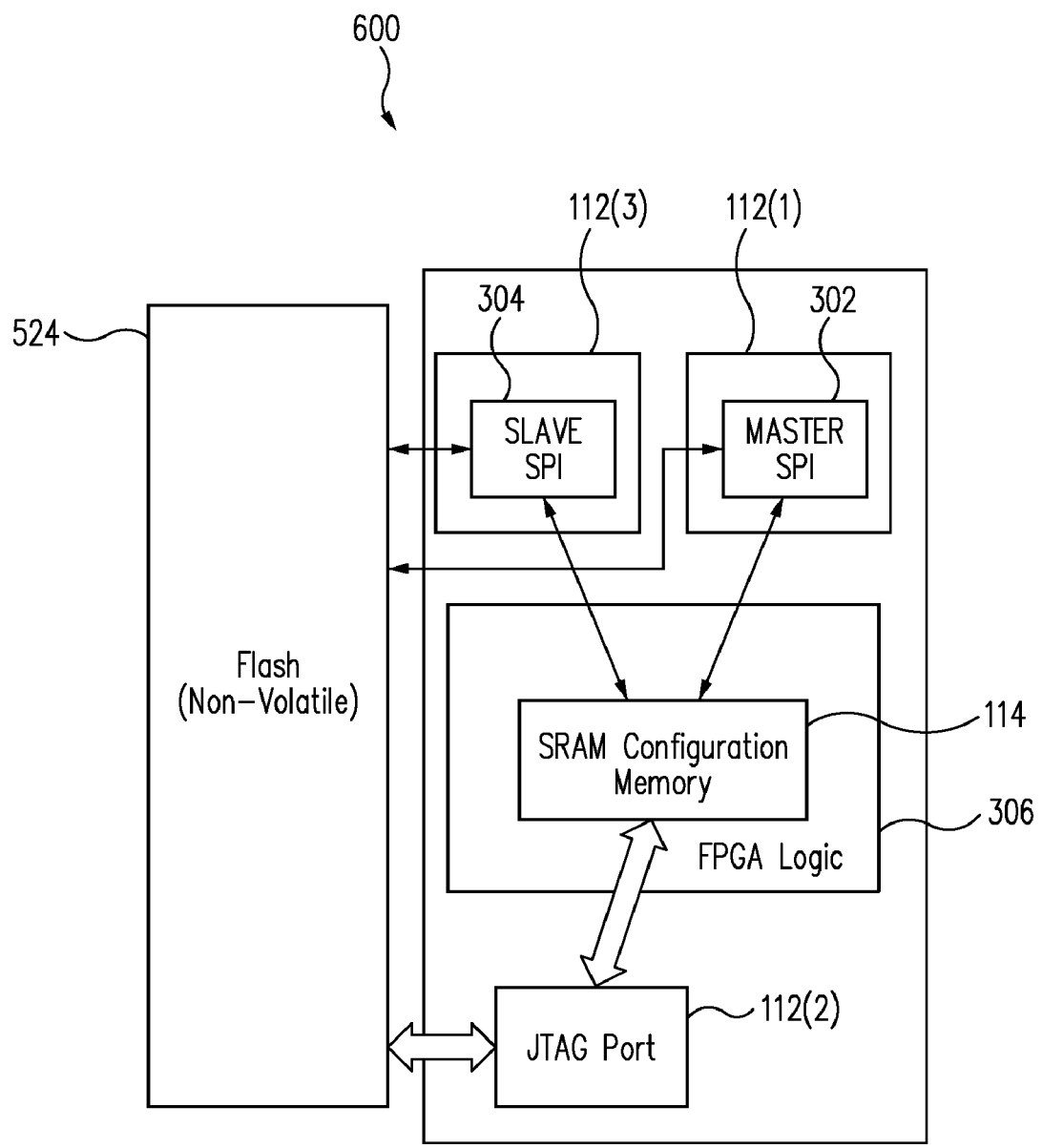
FIG. 8 shows a block diagram illustrating programming options of the programmable logic device of FIG. 6 in accordance with an embodiment of the present invention.

FIG. 8 shows a block diagram illustrating programming options of PLD 600 in accordance with an embodiment of the present invention. It will be appreciated that the embodiment of PLD 600 shown in FIG. 8 may be implemented in a similar fashion as PLD 100 of FIG. 3, with various aspects of PLD 100 also included in PLD 600. PLD 600 of FIG. 6 may additionally be implemented with data port 112(3) and may be connected with external non-volatile memory 524 through any of data ports 112. Master and slave SPI interface blocks 302 and 304 may support data ports 112(1) and 112(3), respectively, any of which may be implemented by dedicated circuits and/or configurable logic (for example, programmable logic blocks 104).

As shown in FIG. 8, configuration memory 114 may be programmed via any of data ports 112. In particular, data port 112(1) (e.g., master SPI port) may program configuration memory 114 through master SPI interface block 302. Data port 112(3) (e.g., slave SPI port) may program configuration memory 114 through slave SPI interface block 304. In addition, data port 112(2) (e.g., JTAG port) may program configuration memory 114.

Figure 9:
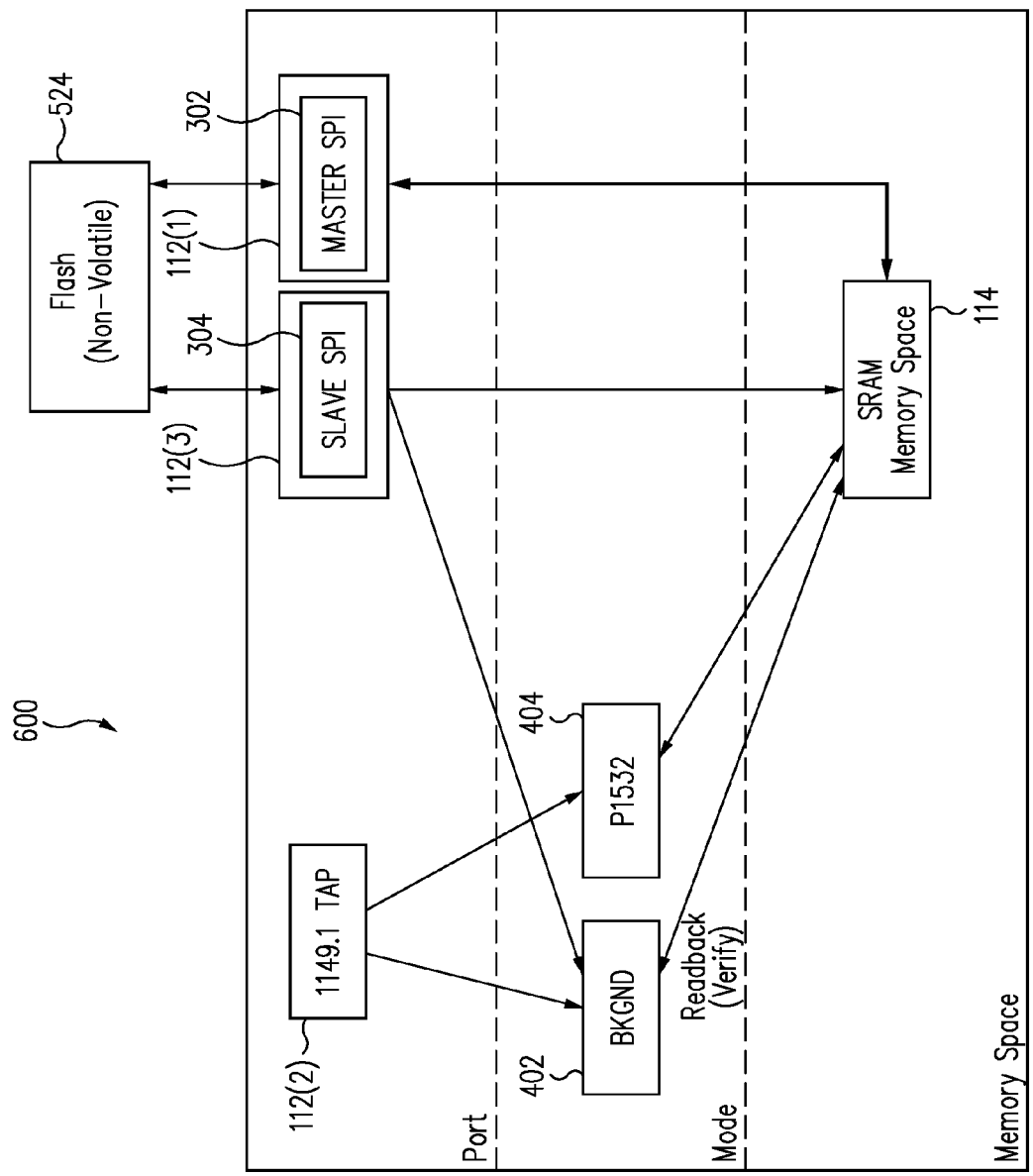
FIG. 9 shows a block diagram illustrating exemplary implementation details of data ports of the programmable logic device of FIG. 6 in accordance with an embodiment of the present invention.

FIG. 9 shows a block diagram illustrating exemplary implementation details of data ports 112(1), 112(2), and 112(3) of PLD 600 in accordance with an embodiment of the present invention. It will be appreciated that the embodiment of PLD 600 shown in FIG. 9 may be implemented in a similar fashion as PLD 100 of FIG. 4, with various aspects of PLD 100 also included in PLD 600. PLD 600 of FIG. 6 additionally includes data port 112(3). FIG. 9 further illustrates that data ports 112(1) and 112(3) are supported by master and slave SPI interface blocks 302 and 304, respectively as previously described with regard to FIG. 8.

Data ports 112(1) and 112(3) may be connected with external non-volatile memory 524. In this regard, data ports 112(1) and 112(3) may provide external data (i.e., information, which may include control signals, configuration data, security bits, or other types of data) from external non-volatile memory 524 to configuration memory 114 (labeled SRAM Memory Space). As also shown in FIG. 9, multiple techniques are provided to program and configure the memory space of PLD 600.

Figure 10:
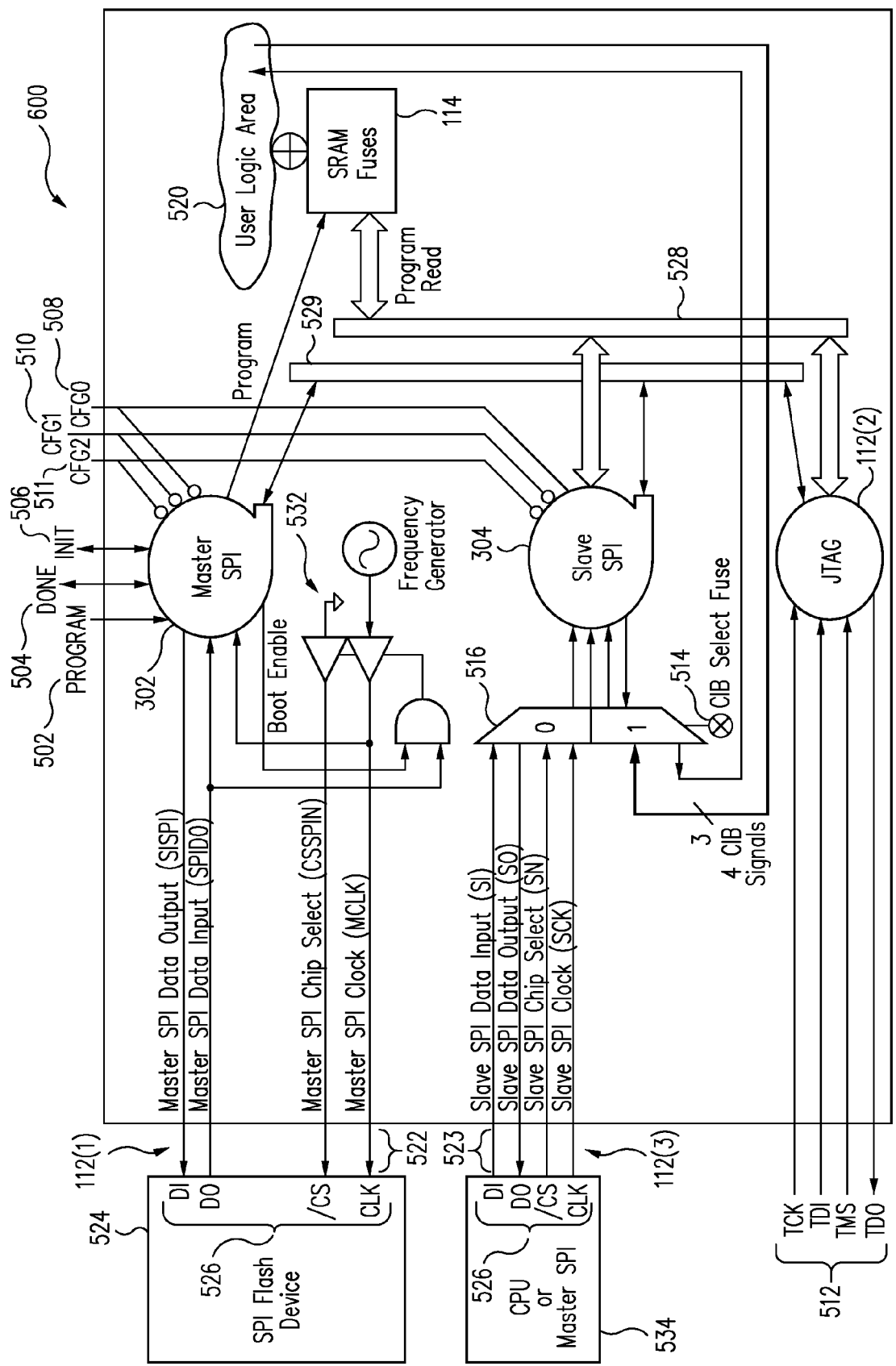
FIG. 10 shows a block diagram illustrating further exemplary implementation details of data ports of the programmable logic device of FIG. 6 in accordance with an embodiment of the present invention.

FIG. 10 shows a block diagram illustrating further exemplary implementation details of data ports 112(1), 112(2), and 112(3) of PLD 600 in accordance with an embodiment of the present invention. It will be appreciated that the embodiment of PLD 600 shown in FIG. 10 may be implemented in a similar fashion as PLD 100 of FIG. 5, with various aspects of PLD 100 shown in FIG. 5 also included in PLD 600. However, in contrast to PLD 100 of FIG. 5, PLD 600 of FIG. 6 may be implemented with additional data port 112(3).

In the embodiment of FIG. 10, data port 112(1) is implemented as a master SPI port 112(1) connected with external non-volatile memory 524 through pins 522. Also in this embodiment, data port 112(3) is implemented as a slave SPI port connected with master SPI device 534 (for example, a data processing device such as a CPU or other appropriate device) through pins 523. In various embodiments, master SPI device 534 may be operated in accordance with software (e.g., a computer program for execution by a computer), stored on a computer-readable medium, configured to instruct master SPI device 534 to perform one or more of the operations described herein.

Similar to PLD 100 of FIG. 5, PLD 600 includes a CIB select fuse 514 may be programmed to select between signals provided at pins 523 and a set of CIB signals 518. It will be appreciated that, in the embodiment of FIG. 10, CIB fuse 514 may operate with an opposite polarity in comparison with the embodiment of FIG. 5. PLD 600 also includes an additional CIB 529 to facilitate communication between master SPI block 302, slave SPI block 304, and data port 112(2) within PLD 600.

Also similar to PLD 100 of FIG. 5, PLD 600 includes configuration pins 508 and 510 (labeled CFG0 and CFG1). Additionally, PLD 600 includes a configuration pin 511 (labeled CFG2). In one embodiment, PLD 600 may be configured to load configuration data from master SPI port 112(1) when configuration pin 511 is set to a logical low value, and configured to load configuration data from slave SPI port 112(3) when configuration pin 511 is set to a logical high value. In the embodiment shown in FIG. 10, configuration pins 508, 510, and 511 are connected with master SPI block 302 and slave SPI block 304, and may be used to further adjust the operation of such blocks as may be desired in particular implementations.

Figure 11:
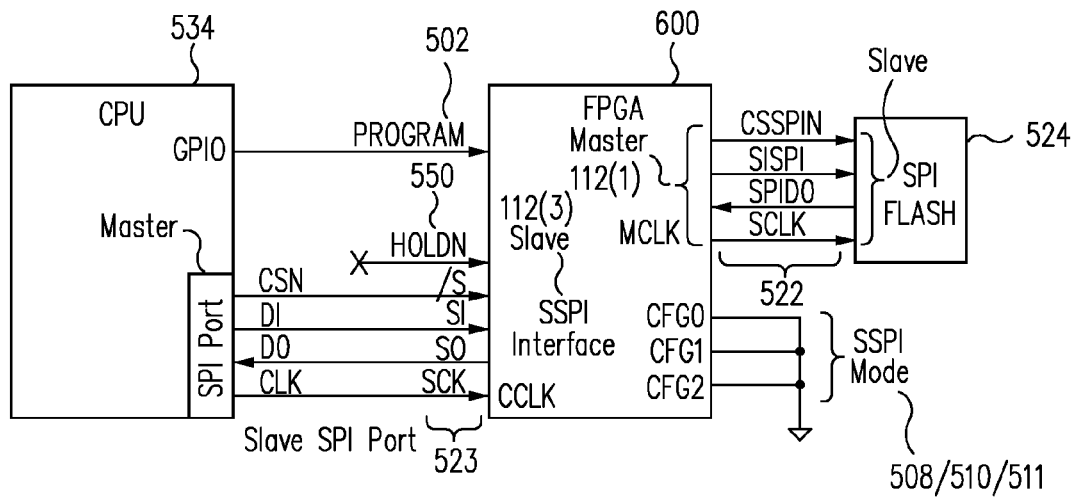
FIG. 11 shows a block diagram illustrating a programmable logic device system in accordance with an embodiment of the present invention.

FIG. 11 shows a block diagram illustrating a programmable logic device system that includes PLD 600, master SPI device 534, and external non-volatile memory 524 in accordance with an embodiment of the present invention. In the embodiment of FIG. 11, PLD 600 is connected with external non-volatile memory 524 through data port 112(1) (implemented in this embodiment as a master SPI port). In addition, PLD 600 is connected with master SPI device 534 (implemented by a CPU in FIG. 11) through data port 112(3) (implemented in this embodiment as a slave SPI port) and PROGRAM pin 502. Also in the embodiment of FIG. 11, PLD 600 is implemented with a HOLD pin 550 which is disconnected from master SPI device 534 in FIG. 11.

PLD 600 may be implemented to boot using configuration data from external non-volatile memory 524 through master SPI port 112(1) when configuration pin 511 is set to a logical low value in the manner shown in the embodiment of FIG. 11. In this regard, PLD 600 may provide a master clock signal to external non-volatile memory 524 through one of pins 522 (e.g., pin SCLK) and receive configuration data from external non-volatile memory 524 through one of pins 522 (e.g., pin SPIDO) for loading into configuration memory 114. For example, referring to FIG. 10, it will be appreciated that configuration data received through pin SPIDO of PLD 600 may be programmed into configuration memory 114 through master SPI block 302.

PLD 600 may be further implemented to facilitate programming external non-volatile memory 524 from master SPI device 534. In this regard, PLD 600 may receive data from master SPI device 534 through pin SI of data port 112(3). Referring to FIG. 10, it will be appreciated that data received through pin SI of PLD 600 may be passed between slave SPI block 304 and master SPI block 302 through CIB 529, and out pin SISPI to external non-volatile memory 524. In addition, by toggling PROGRAM pin 502, master SPI device 534 may command PLD 600 boot from external non-volatile memory 524.

Figure 12:
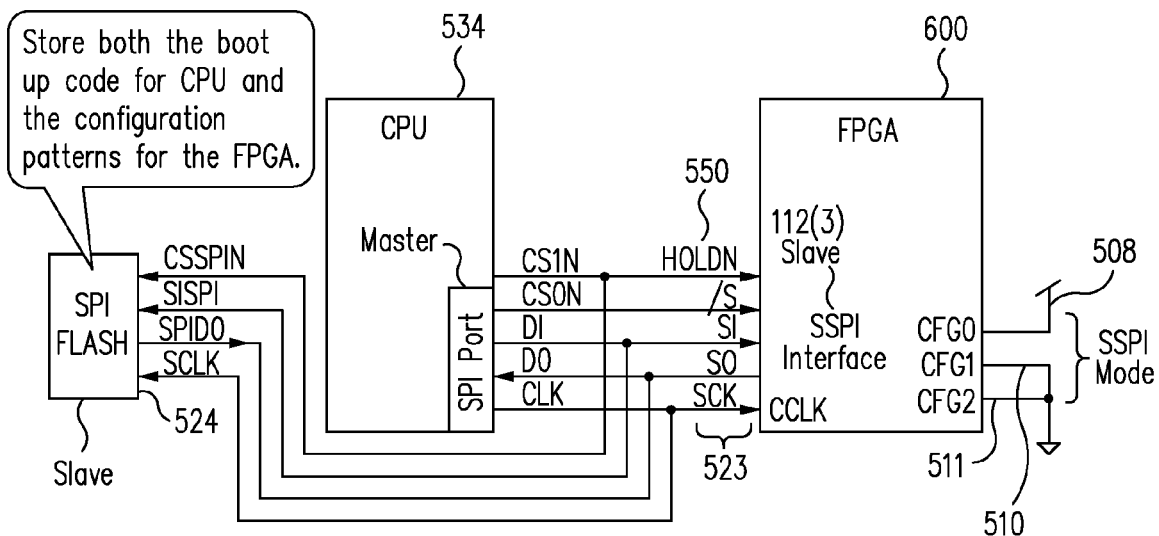
FIG. 12 shows a block diagram illustrating another programmable logic device system in accordance with an embodiment of the present invention.

FIG. 12 shows a block diagram illustrating another programmable logic device system that includes PLD 600, master SPI device 534, and external non-volatile memory 524 in accordance with an embodiment of the present invention. In the embodiment of FIG. 12, PLD 600 is connected with external non-volatile memory 524 and master SPI device 534 (implemented by a CPU in FIG. 11) through data port 112(3) (implemented in this embodiment as a slave SPI port). Also in the embodiment of FIG. 12, PLD 600 is further connected with master SPI device 534 through HOLD pin 550. Optionally, PROGRAM pin 502 may be omitted from PLD 600 in the embodiment shown in FIG. 12.

Master SPI device 534 may be configured by appropriate boot code stored by external non-volatile memory 524. In this regard, a master SPI port of master SPI device 534 may be connected with a slave SPI port external non-volatile memory 524 to synchronize the transfer of boot code from external non-volatile memory 524 to master SPI device 534 using a clock signal provided from the master SPI port of master SPI device 534 to the slave SPI port of external non-volatile memory 524.

Following the configuration of master SPI device 534, PLD 600 may be implemented to boot using configuration data received through data port 112(3) when configuration pin 511 is set to a logical high value in the manner shown in the embodiment of FIG. 12. In this regard, PLD 600 may be implemented to receive configuration data from data port 112(3) under the control of master SPI device 534. For example, in one embodiment, master SPI device 534 may provide a logical low signal to a chip select pin (labeled /S in FIG. 12) of data port 112(3) and subsequently shift a write command to a data input pin (labeled SI in FIG. 12) to prepare PLD 600 to receive configuration data through data port 112(3).

Master SPI device 534 may then read configuration data from external non-volatile memory 524 and shift the configuration data into PLD 600. For example, in one embodiment, master SPI device 534 may read an entire configuration data bitstream from external non-volatile memory 524 into memory of master SPI device 534, and then pass the bitstream to PLD 600 through data port 112(3).

In another embodiment, master SPI device 534 may read a portion (e.g., a frame or segment) of a configuration data bitstream from external non-volatile memory 524 into memory of master SPI device 534, and then pass the portion on to PLD 600 through data port 112(3). Additional portions of the configuration data bitstream can be repeatedly read and passed until an entire configuration data bitstream is provided to PLD 600. While reading each portion of the configuration data bitstream, master SPI device 534 may drive HOLD pin 550 to a logical low state to instruct PLD 600 to wait to receive the next portion of the configuration data bitstream.

In view of the present disclosure, it will be appreciated that a programmable logic device having for example one or more data ports supporting convenient programming interfaces (e.g., SPI ports) can provide a variety of flexible options for loading configuration data into onboard memory (such as non-volatile flash memory and SRAM memory cells) and/or external memory (such as external non-volatile or volatile memory). It will further be appreciated that a programmable logic device implemented in accordance with one or more of the embodiments described herein allows SPI interface blocks, used to support a programming interface (e.g., a data port), to also support user-defined operation.

Although various features have been described herein with regard to external non-volatile memory 524, it will be appreciated that any volatile or non-volatile memory may be used in conjunction with the various data ports described herein where appropriate. It will also be appreciated that various features described herein with respect to configuration memory 114 of FIGS. 6-12 may be applied to non-volatile memory 106 when optionally included in PLD 600.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD) comprising:
a slave port adapted to receive a configuration data bitstream and a slave clock signal from a master port of a first external device, wherein the bitstream is clocked from the first external device to the PLD by the slave clock signal;
a master port adapted to provide the configuration data bitstream and a master clock signal from the PLD to a slave port of a second external device, wherein the bitstream is clocked from the PLD to the second external device by the master clock signal; and
an interface block adapted to pass the configuration data bitstream from the slave port through the PLD to the master port.

2. The programmable logic device of claim 1, wherein the slave port and the master port of the PLD are serial ports.

3. The programmable logic device of claim 1 including a common interface block coupled between the slave port of the PLD and the master port of the PLD, the common interface block adapted to pass the configuration data bitstream from the slave port to the master port under control of the PLD.

4. A programmable logic device system including the programmable logic device of claim 1, the first external device, and the second external device, wherein the first external device is a data processing device and the second external device is a non-volatile memory device.

5. A programmable logic device (PLD) comprising:
a slave serial peripheral interface (SPI) port adapted to receive a configuration data bitstream and a slave clock signal from a master SPI port of an external device, wherein the bitstream is clocked from the external device to the PLD by the slave clock signal; and
configuration memory adapted to store the configuration data bitstream received by the slave SPI port for configuring the PLD.

6. The programmable logic device of claim 5, wherein the external device is a data processing device.

7. The programmable logic device of claim 5, wherein the configuration memory is volatile memory.

8. A programmable logic device system comprising:
a first external device including a master port;
a second external device including a slave port connected to the master port of the first external device; and
a programmable logic device (PLD) including a slave port connected to the master port of the first external device,
wherein the first external device is adapted to receive configuration data from the slave port of the second external device through the master port and to pass the configuration data from the master port to the slave port of the PLD.

9. The programmable logic device system of claim 8, wherein the slave ports and the master ports are serial ports.

10. The programmable logic device system of claim 8, wherein the slave ports and the master ports are serial peripheral interface ports.

11. The programmable logic device system of claim 8, wherein the first external device is adapted to first receive in its memory an entire configuration data bitstream from the second external device and then pass the entire configuration data bitstream to the PLD.

12. The programmable logic device system of claim 8, wherein the first external device is adapted to repeatedly receive in its memory portions of an entire configuration data bitstream from the second external device and then pass the portions to the PLD until the entire configuration data bitstream is passed to the PLD.

13. The programmable logic device system of claim 8, wherein the first external device is a data processing device and the second external device is a non-volatile memory device.

14. The programmable logic device system of claim 8, wherein the slave port of the PLD is connected to the slave port of the second external device and to the master port of the first external device.

* * * * *